(12) United States Patent
Selli et al.

(10) Patent No.: US 6,621,443 B1
(45) Date of Patent: Sep. 16, 2003

(54) SYSTEM AND METHOD FOR AN ACQUISITION OF DATA IN A PARTICULAR MANNER

(76) Inventors: Basilio Selli, 8 Kental La., Nesconset, NY (US) 11741; Mário Missawa, Rua Elpidio Gomes 1398, Sertãozinho, Sao Paulo (BR), CEP 14160-620

( * ) Notice: Subject to any disclaimer, the term of this patent is extended or adjusted under 35 U.S.C. 154(b) by 0 days.

(21) Appl. No.: 10/262,000

(22) Filed: Oct. 1, 2002

(51) Int. Cl.$^7$ .............................................. H03M 1/78
(52) U.S. Cl. ..................... 341/155; 341/110; 341/161
(58) Field of Search ................................. 341/155, 161, 341/159, 158, 160, 110; 329/363; 375/222; 324/763

(56) References Cited

U.S. PATENT DOCUMENTS

| | | | | |
|---|---|---|---|---|
| 4,673,916 A | * | 6/1987 | Kitamura et al. | 341/110 |
| 4,769,613 A | * | 9/1988 | Sawata et al. | 329/363 |
| 4,812,043 A | | 3/1989 | Vanstaen | 356/385 |
| 5,199,046 A | * | 3/1993 | Ling | 375/222 |
| 5,461,329 A | | 10/1995 | Linehan et al. | 324/772 |
| 5,617,037 A | * | 4/1997 | Matsumoto | 324/763 |
| 5,619,202 A | | 4/1997 | Wilson et al. | 341/143 |
| 5,671,257 A | | 9/1997 | Cochran et al. | 375/355 |
| 6,144,513 A | | 11/2000 | Reed et al. | 360/51 |
| 6,166,673 A | | 12/2000 | Odom | 341/155 |

OTHER PUBLICATIONS

Xiaochu Xu et al., "Variable–Sampling Rate Sigma–Delta Modulator for Instrumentation and Measurement," IEEE Transactions on Instrumentation and Measurement, vol. 44 No. 5, Oct. 1995.

* cited by examiner

Primary Examiner—Jean Bruner JeanGlaude
(74) Attorney, Agent, or Firm—Baker Botts LLP

(57) ABSTRACT

A data acquisition method and system for obtaining digital samples are provided. A first digital sample related to an analog signal is obtained after a first time period. A second digital sample related to the analog signal is obtained after a second time period. The second digital sample is provided on at least one output if magnitudes of the first digital sample and the second digital sample differ from one another by a predetermined threshold.

62 Claims, 12 Drawing Sheets

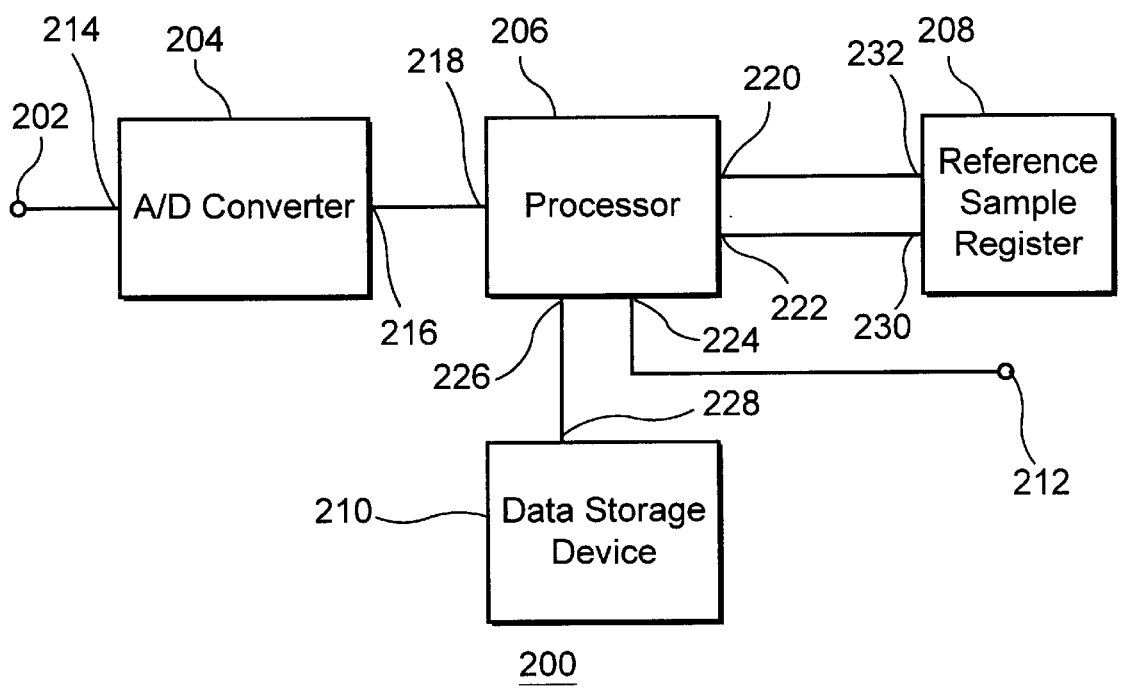
F I G. 2

SYSTEM AND METHOD FOR AN ACQUISITION OF DATA IN A PARTICULAR MANNER

FIELD OF THE INVENTION

The present invention relates generally to a system and method for acquiring data, and more particularly to a system and method for acquiring the data by converting analog signals received from sensors to digital signals utilizing a variable sampling rate with high resolution and a capability for fast reading of such data.

BACKGROUND OF THE INVENTION

Analog-to-digital ("A/D") converters and digital-to-analog ("D/A") converters have recently come into widespread use with the development of suitable process technology and the increase in digital audio, digital video and other applications. Typically, A/D converters convert an analog input signal into digital output samples at a predetermined rate.

One of the limitations of the conventional A/D converters is that they determine the magnitude of a property of the analog input signal at a predetermined precision only at equally spaced temporal intervals. Such process is known as the "uniform sampling," process in which each sample is provided at the output of the A/D converter at the predetermined precision, e.g., an eight-bit sample. Additionally, with the conventional A/D converters, the sample rate at which the A/D converter operates can not be made independent of the master clock signal used for clocking the A/D converter. The sample rate is likely some integer division of the master clock signal. Further, if the property of the analog input signal changes rapidly, the A/D converter has no capacity to provide a less precise sample at a shortened sample rate.

Certain publications relate to devices and systems utilizing particular sampling devices. For example, U.S. Pat. No. 5,619,202 issued to Wilson et al. describes a method and device for performing A/D conversion using sigma-delta modulation of the temporal spacing between samples. The device described in this publication includes a conventional sigma-delta A/D converter and uses a particular procedure to perform non-linear sampling. The non-linear sampling is achieved by sampling, at a constant rate, the A/D conversion stage, and then utilizing a decimator to decimate the digital samples to match the selected output sample rate.

Another conventional system for data acquisition to digitize and store analog data at a selectable sample rate is described in U.S. Pat. No. 6,166,673 issued to Odom. As described in this publication, the analog signal is first passed through an A/D converter with a high sampling rate. Control logic then collects the samples, and distributes the samples to N memory partitions at a reduced rate equal to the original clock frequency divided by N. The N memory partitions are configurable to be enabled or disabled. In particular each memory partition contains only a portion of the converted digital signal, thus allowing a selectable effective sampling rate.

U.S. Pat. No. 4,812,043 to Vanstaen describes a method and apparatus for measuring a physical quantity (such as the thickness of a textile yarn through a feeding machine) using two identical measuring devices. The first measuring device described in this publication outputs an electrical current or voltage which is a function of the value of such physical quantity. Simultaneously, a second identical measuring device measures a reference value for this physical quantity. The first signal is output to an input of an A/D converter with a variable threshold value. The second signal is applied to the other input of the A/D converter (which determines the variable threshold value). The sampling rate may be determined by a physical movement in the yarn feeding system.

OBJECTS AND SUMMARY OF THE INVENTION

One of the objects of the present invention is to provide a data acquisition system and method which can forward samples of an analog signal at various precisions at various clock intervals. This object can be achieved with the exemplary arrangement and method in which a first digital sample related to an analog signal after a first time period is obtained, then a second digital sample related to the analog signal is relieved after a second time period. The second digital sample is produced at an at least one output if the first digital sample and the second digital sample differ by a predetermined threshold.

Another object of the present invention is to provide a data acquisition system which can perform such procedure. Such exemplary system may include a data processing unit which has at least one data input and at least one data output. When executing a computer program, the data processing unit is adapted to obtain a first digital sample related to an analog signal after a first time period, and a second digital sample related to the analog signal after a second time period. Thereafter, the data processing unit can be adapted to compare the second digital sample to the first digital sample, and produce the second digital sample at the at least one data output if the first digital sample and the second digital sample differ by more than a predetermined threshold.

In another exemplary embodiment of the present invention, the data acquisition system also includes an analog to digital converter which has an input and at least one output. The input can be configured to receive an analog signal, and the output may be configured to provide a digital representation of the analog signal. The output is operatively connected to a data input of a data processing unit.

BRIEF DESCRIPTION OF THE DRAWINGS

Further objects, features and advantages of the invention will become apparent from the following detailed description taken in conjunction with the accompanying figures showing illustrative embodiments of the invention, in which:

FIG. 2 is an exemplary embodiment of a data acquisition system according to the present invention which samples signals at an adjustable sampling rate;

Figure 1:
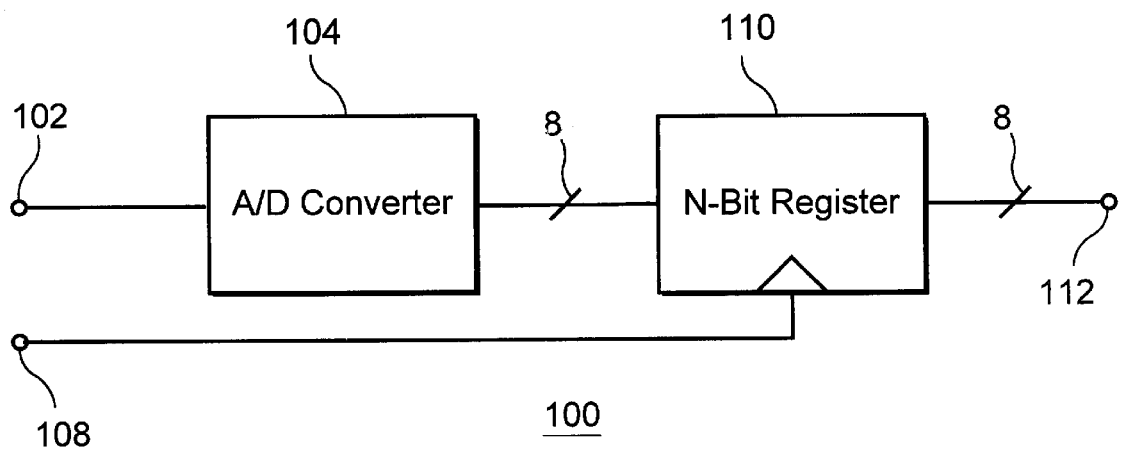
FIG. 1 is a block diagram of a conventional analog to digital converter.

Throughout the figures, the same reference numerals and characters, unless otherwise stated, are used to denote like features, elements, components or portions of the illustrated embodiments. Moreover, while the present invention will now be described in detail with reference to the figures, it is done so in connection with the illustrative embodiments. It is intended that changes and modifications can be made to the described embodiments without departing from the true scope and spirit of the subject invention as defined by the appended claims.

DETAILED DESCRIPTION OF PREFERRED EMBODIMENTS

FIG. 1 illustrates a conventional data acquisition system 100 which samples signals at a fixed rate. The data acquisition system 100 includes a data input 102, an analog to digital ("A/D") converter 104, a clock input 108, an n-bit register 110, and an eight-bit digital output 112. The A/D converter 104 includes a data input and an eight-bit digital output. The n-bit register 110 includes an eight-bit digital input, a clock input, and an eight-bit digital output.

The data acquisition system 100 receives the analog signal at the data input 102, and a clock signal at the clock input 108. The analog input 102 is connected to the data input of the analog to digital converter 104. The A/D converter 104 converts the analog signal received at the analog input 102 into a digital representation of the analog signal. The digital representation of the analog signal is provided at the eight-bit digital output of the A/D converter 104. The digital output of the A/D converter 104 is connected to the eight-bit digital input of the n-bit register 110. The n-bit register 110 receives the signals provided by the analog to digital converter 104 at the digital input of the n-bit register 110, and provides those signals to the eight-bit digital output upon the receipt of a positive edge, i.e., a change from a logical low or logical zero voltage level to a logical high or logical one voltage level of the clock signal. In one example, a logical zero voltage can be 0 Volts, and a logical high voltage may be 5 Volts. The period of the clock signal is fixed to be equal to the sampling rate. Therefore, if the A/D converter 100 is designed for sampling the analog signal every 0.1 seconds, the period of the clock signal would also be 0.1 seconds, and the frequency of the clock signal would be 10 Hz. The digital output of the n-bit register 110 is connected to the digital output 112. The n-bit register 110 therefore drives a sample, which is the digital representation of the analog signal received at the digital input of the n-bit register 110, to the digital output 112 once per clock cycle.

FIG. 2 illustrates an exemplary embodiment of a data acquisition system 200 according to the present invention. The data acquisition system 200 is capable of varying its sampling rate and sample precision in accordance with, e.g., variations in the magnitude of an input analog signal. The sampling rate of the data acquisition system 200 can be regulated by a processor 206 thereof. The processor 206 can perform derivative detection functions on a digital representation of one or more properties of an input analog signal (received at an input 202 of the data acquisition systems 200) to monitor changes in such properties of the input analog signal. The one or more properties of the input analog signal can be voltage, current, or the like. When the input analog signal goes up or down in magnitude beyond a predetermined threshold, the processor 206 can respond by sampling the properties of the input analog signal at a different rate than the previous rate at which such properties were sampled. This different rate causes more samples to be generated over a given period of time than the previous rate would allow. As a result of increasing the sampling rate of the input analog signal, more samples can be taken of a rapidly changing analog signal, thereby creating a more accurate representation of the signal. In another embodiment of the present invention, the sampling rate can vary between 20 ms and 320 ms. Conversely, when the rate of change of the property(s) of the input analog signal falls to a more constant level, the processor 206 may decrease the sampling rate of the data acquisition system 200 to the previous slower rate, thereby taking samples in a less frequent manner.

The processor 206 provides a digital representation of the analog signal having a particular precision or output resolution based on a period of time (e.g., an acquisition time). If the property(s) of the input analog signal changes rapidly, a shorter acquisition time is preferably utilized. Therefore, the processor 206 can produce a digital representation of the analog signal having a lower precision. For example, if the acquisition time necessary is 160 ms the output resolution will be 16 bits, therefore only the sixteen most significant bits of the digital sample will be accurate. The output resolution able to be produced by the processor 206 given a particular acquisition time is given in the following table:

| Output Resolution (bits) | Acquisition Time (ms) |
| --- | --- |
| 17 | 320 |
| 16 | 160 |
| 15 | 80 |
| 14 | 40 |
| 13 | 20 |

The sampling rate is equal to one over the acquisition time.

The data acquisition system 200 includes the data input 202, an analog to digital converter 204, the processor 206, a reference sample register 208, a data storage device 210, and sample data output 212. The analog to digital converter 204 includes an analog input 214 and a digital signal output 216. The processor 206 includes a digital signal input 218, a reference sample input 220, a reference sample output 222, a memory interface 226, and a current sample output 224. The reference sample register 208 includes a data input 230 and a data output 232. The data storage device 210 includes an access interface 228. In an exemplary embodiment, the data storage device 210 is volatile memory.

The data acquisition system 200 receives an analog data signal at the data input 202. The data input 202 is connected to the analog input 214 of the analog to digital (A/D) converter 204. The A/D converter 204 provides a digital representation of a property of the analog signal at the digital output 216 of the A/D converter 204. The property of the analog signal portrayed by the digital representation of the analog signal can be voltage, current, or the like. The digital representation of the property of the analog signal is provided on the digital output 216 of the A/D converter 204. The digital representation of the analog signal can appear as a series of pulses, such that when the property of the analog signal increases more pulses are produced in a given period of time, and when the property of the analog signal decreases fewer pulses are produced in the given period of time. The digital output 216 of the A/D converter 204 is connected to the digital signal input 218 of the processor 206.

The processor 206 receives the digital signal produced by the A/D converter 204 at the digital signal input 218. The memory interface 226 of the processor 206 is connected to the access interface 228 of the data storage device 210. The access interface of the data storage device 210 allows data to be written to and read from the data storage device 210. The reference sample output 222 of the processor 206 is connected to the data input 230 of the reference sample register 208, and the reference sample input 220 of the processor 206 is connected to the data output 232 of the reference sample register 208. The current sample output 224 of the processor 206 is connected to the sample data output 212.

Figure 3:
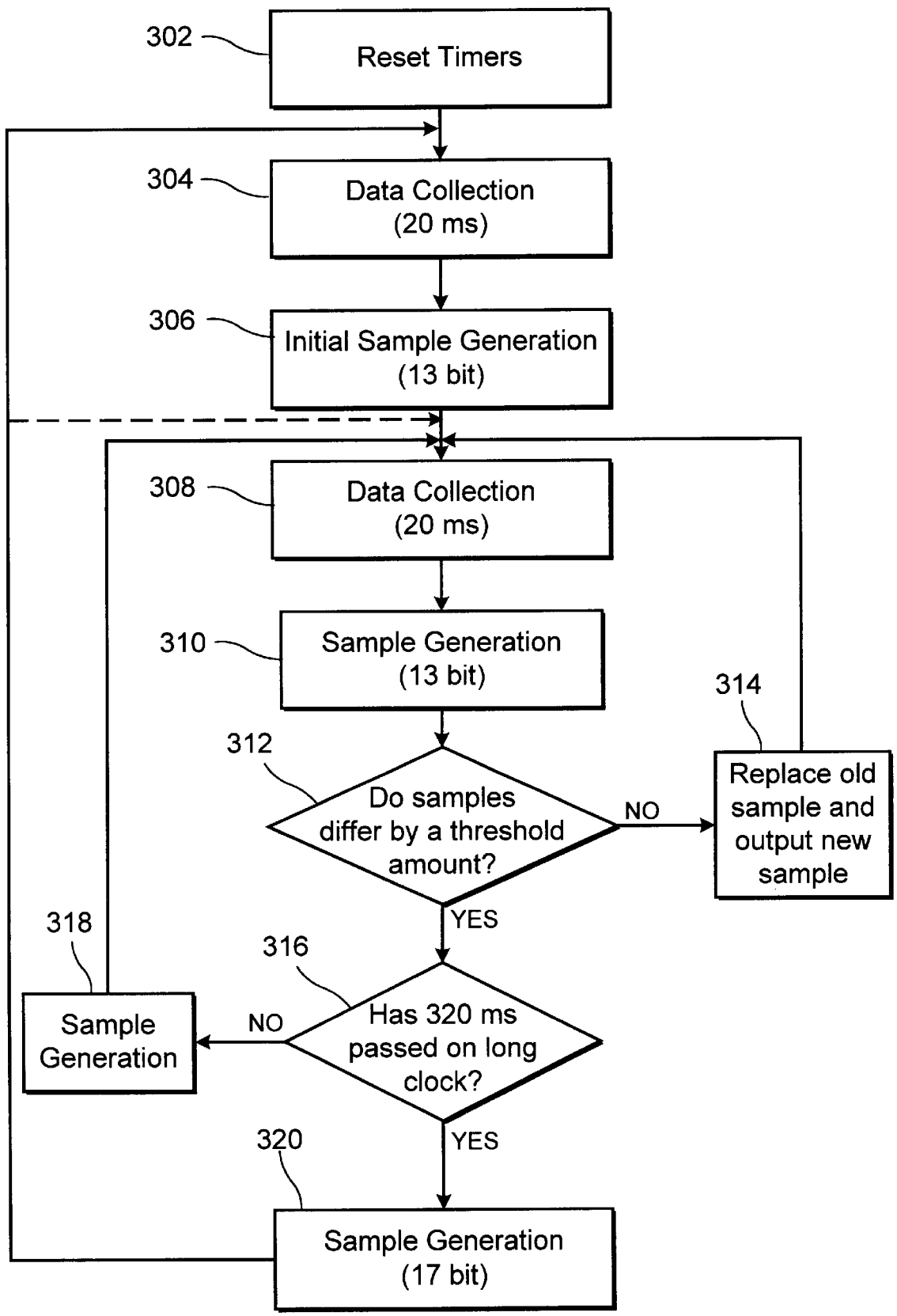
FIG. 3 is an exemplary embodiment of a flow chart illustrating a process according to the present invention with which the data is collected by the data acquisition system of FIG. 2.

Every time the processor 206 detects a pulse in the digital signal received at the digital signal input 218 from the A/D converter 204, the processor 206 creates a data record and stores it in the data storage device 210. Each data record may describe various characteristics of the digital signal received at the digital signal input 218. In an exemplary embodiment, the processor 206 records a start time and a duration time for each pulse of the digital signal received at the digital signal input 218. The processor 206 utilizes the stored data records to create samples that are representative of the property of the input analog signal according to a process 300, as shown in FIG. 3 and which shall be described in greater detail herein. Once the sample is created, it is either stored in the reference sample register 208 or it is provided to the sample data output 212. The processor 206 writes a new reference sample to the reference sample register 208 utilizing the references sample output 222, and reads the current reference sample from the reference sample register 208 utilizing the reference sample input 220.

FIG. 3 shows a flow chart which illustrates an exemplary embodiment of the process 300 through which the data acquisition system 200 varies its sampling rate and sample precision in accordance with, e.g., variations in magnitude of a property of the input analog signal. The process 300 begins in step 302 when the processor 206 sets a global clock, a long clock and a short clock to 0 ms.

In step 304, the processor 206 begins collecting data via the digital signal input 218 from the A/D converter 204. The processor 206 creates a record of each pulse of the digital signal received at the digital signal input 218 of the processor 206, including a start time of each pulse, in the data storage device 210. The start time of a pulse is the time, that is related to the global clock, when a property of the digital signal rises above a particular value. The processor 206 continues to collect data from the A/D converter 204 until, e.g., 20 ms passes on the short clock. At that point, the processor 206 can reset the short clock to 0 ms, and advance the processing to step 306.

Figure 4A:
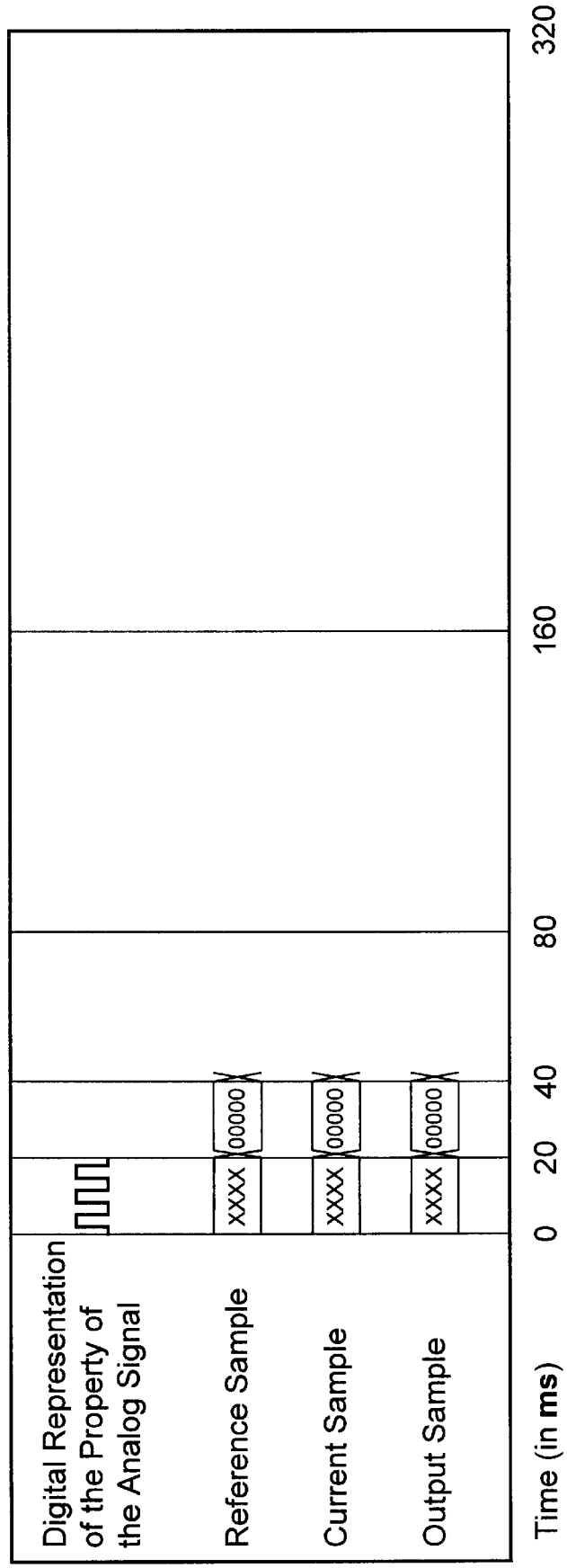
FIGS. 4A–4J are exemplary embodiments of progressive timing diagrams illustrating selected signals according to the present invention with which provides samples of a signals according to the flow chart of FIG. 3.

In step 306, a thirteen-bit current sample can be generated by the processor 206 which is provided to the sample data output 212 as the output sample, and stored in the reference sample register 208 as the reference sample. A timing diagram 400 of selected signals of the process 300 up to this exemplary point in time is shown in FIG. 4A. The processor 206 creates the sample by dividing the number of samples collected during the last 20 ms of the global clock by 20 ms. Once the current sample is generated, the processor 206 stores the current sample in the reference sample register 208 via the reference sample output 222 of the processor 206, and provides the current sample to the sample data output 212. In another exemplary embodiment, the reference sample can be stored in memory by software, i.e., instead of in the reference sample register 208.

In step 308, the processor 206 continues collecting data from the A/D converter 204. The processor 206 also continues to create a record for each pulse of the digital signal received at the digital signal input of the processor 206 (including the start time of each pulse) in the data storage device 210. Once 20 ms passes on the short clock, the processor 206 resets the short clock to 0 ms and, advances to step 310. In step 310, a thirteen-bit current sample is generated by the processor 206. For example, the processor 206 creates the current sample by dividing the number of samples collected during the last 20 ms of the global clock by 20 ms.

Figure 4B:
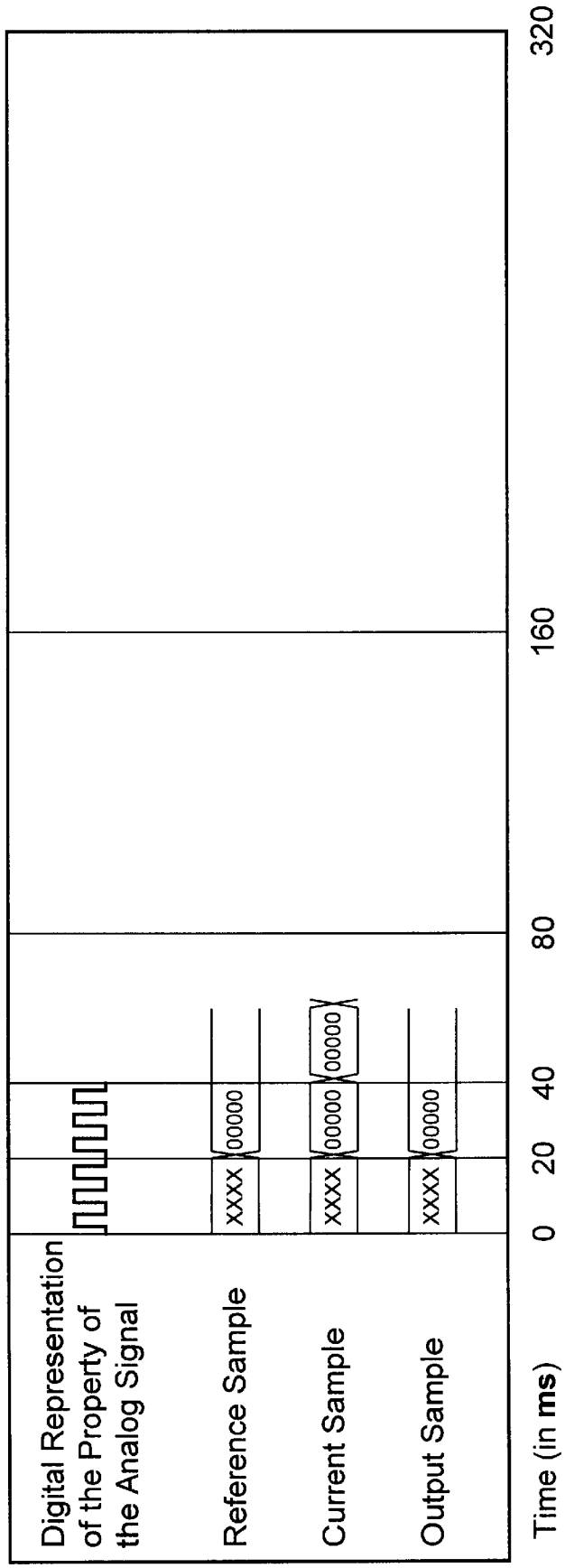

In step 312, the processor 206 compares the thirteen-bit current sample with the thirteen-bit reference sample. The processor 206 reads the reference sample from the reference sample register 208 via the reference sample input. For example, if the current sample and the reference sample match exactly, bit for bit, the process 300 advances the processing to step 316. A timing diagram 401 of selected signals used in the process 300 illustrates this exemplary scenario, as shown in FIG. 4B. Referring again to FIG. 4B, the exemplary current sample has a value of '00000H after 40 ms has passed as does the reference sample. If the current sample and the reference sample differ by at least one bit, i.e., signifying a change in magnitude of an property of the analog input signal beyond a threshold amount, the process 300 advances to step 314. Timing diagrams 402, 405, 407, 409 of selected signals used in the process 300 illustrate this scenario at various times, as shown in FIGS. 4C, 4F, 4H, 4J, respectively.

Figure 4C:
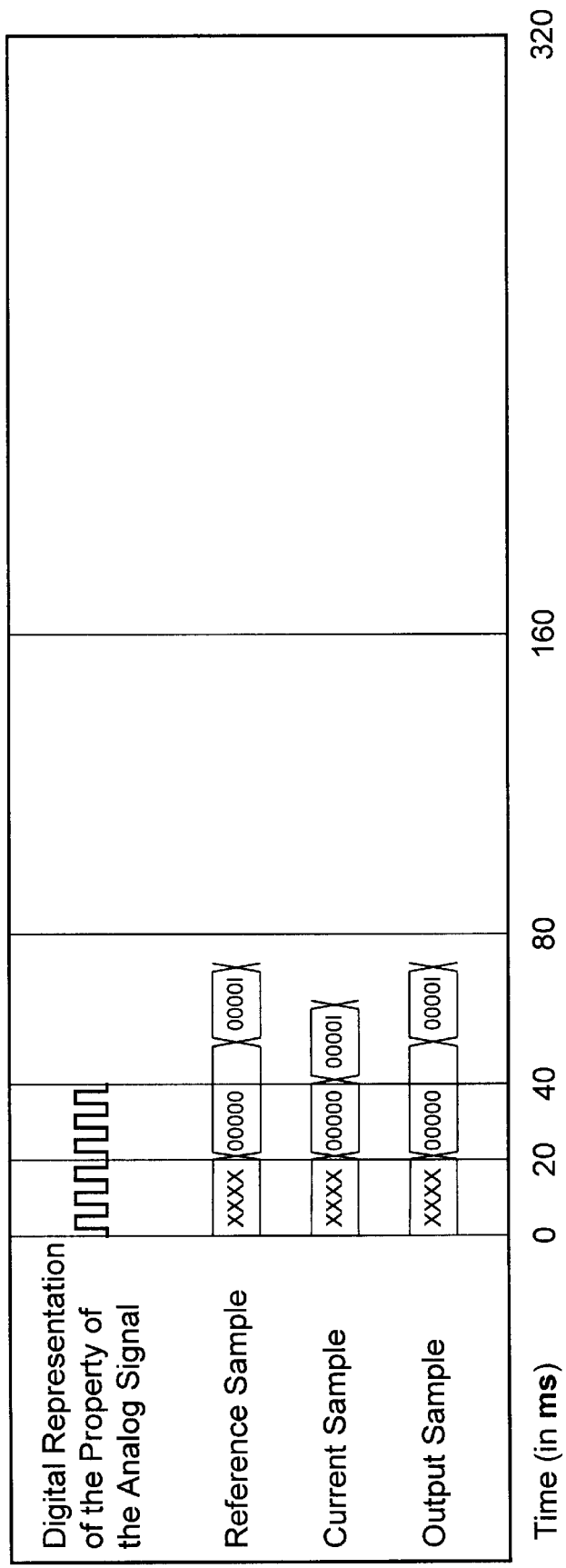

In particular, referring to FIG. 4C, the current sample can have a value of '000001H after, e.g., 40 ms has passed; however the reference sample has a value of '00000H at the same time. In another exemplary embodiment, the threshold amount can be a predetermined percentage. In yet another embodiment, the threshold amount may be a predetermined amount.

Figure 4D:
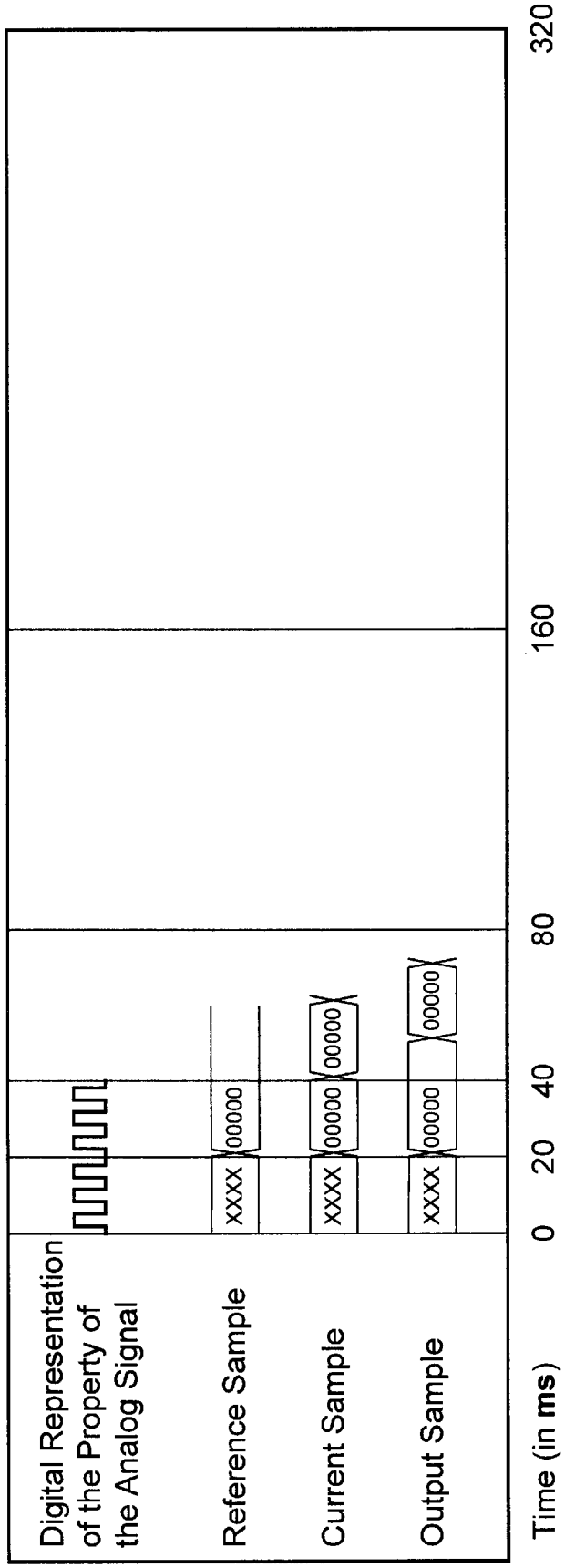
Figure 4E:
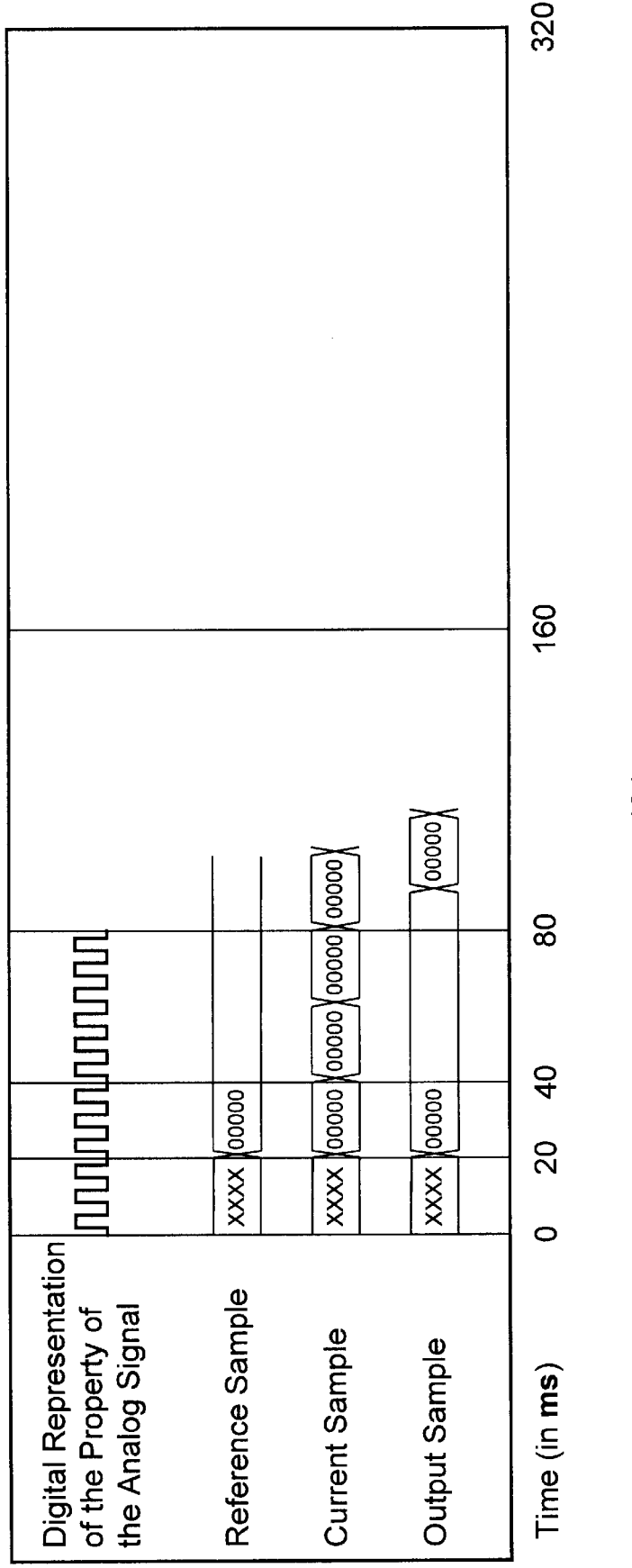
Figure 4F:
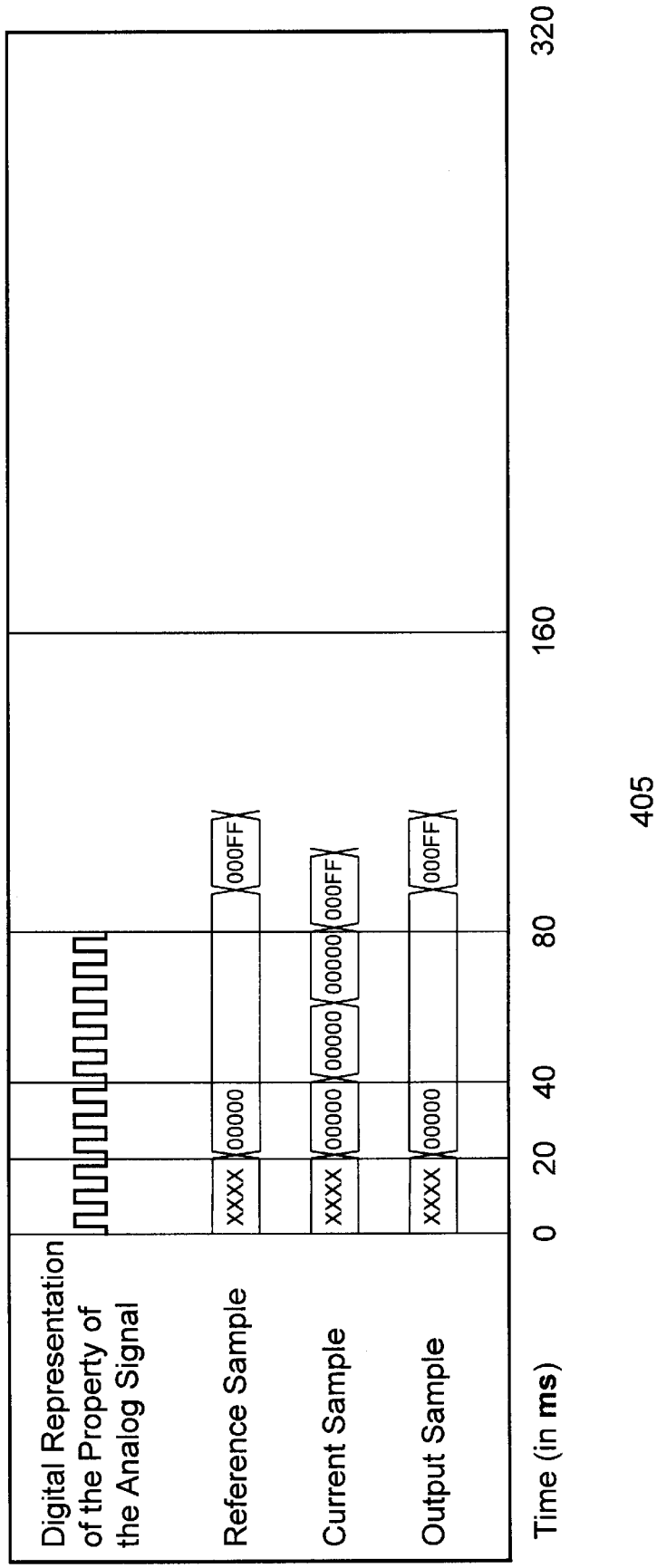

Referring to FIG. 4F, a graph 405 provides the current sample having a value of '000FFH after 80 ms has passed, however the reference sample has a value of '00000H at the same time. Also referring to FIG. 4H, a graph 407 provides the current sample having a value of '00011H after 160 ms has passed, but the reference sample has a value of '00000H at the same time. Further, referring to FIG. 4J, a graph 409 provides the current sample having a value of '00011H after 320 ms has passed. However the reference sample has a value of '00000H at the same time.

In step 314, a new reference sample and a new output should be obtained. For example, the processor 206 writes the current sample into the reference sample register 208 via the reference sample output 222 of the processor 206. The processor 206 also provides the thirteen-bit current sample to the data output 212, and resets the long clock and the short clock to, e.g., 0 ms. In step 316, the processor 206 determines if, e.g., 320 ms has passed on the long clock. If 320 ms has indeed passed on the long clock, the process 300 advances to step 318. If 320 ms has not passed on the long clock, the processor 206 sets the short clock to 0 ms, and the process 300 advances to step 318. In another exemplary embodiment, if 320 ms has not passed on the long clock, the processor 206 sets the short clock to 0 ms, and the process 300 advances to step 308.

In step 318, the process 300 determines if the next most precise output sample can be created and provided at the current sample output. If the difference between the long clock and the short clock is 40 ms, the processor 206 can create a fourteen-bit output sample by dividing the number of samples collected during the last 40 ms of the global clock by 40 ms, and may provide the fourteen-bit output sample to the current sample output. A timing diagram 403 of selected signals used in the process 300 illustrates this scenario is shown in FIG. 4D. In particular, referring to FIG. 4D, the current sample has a value of '00000H after 40 ms has passed as does the reference sample. Therefore, a new fourteen-bit precision sample is provided as the output sample. If the difference between the long clock and the short clock is 80 ms, the processor 206 creates a fifteen-bit output sample by dividing the number of samples collected during the last 80 ms of the global clock by 80 ms and provides the fifteen-bit output sample to the current sample output.

Figure 4G:
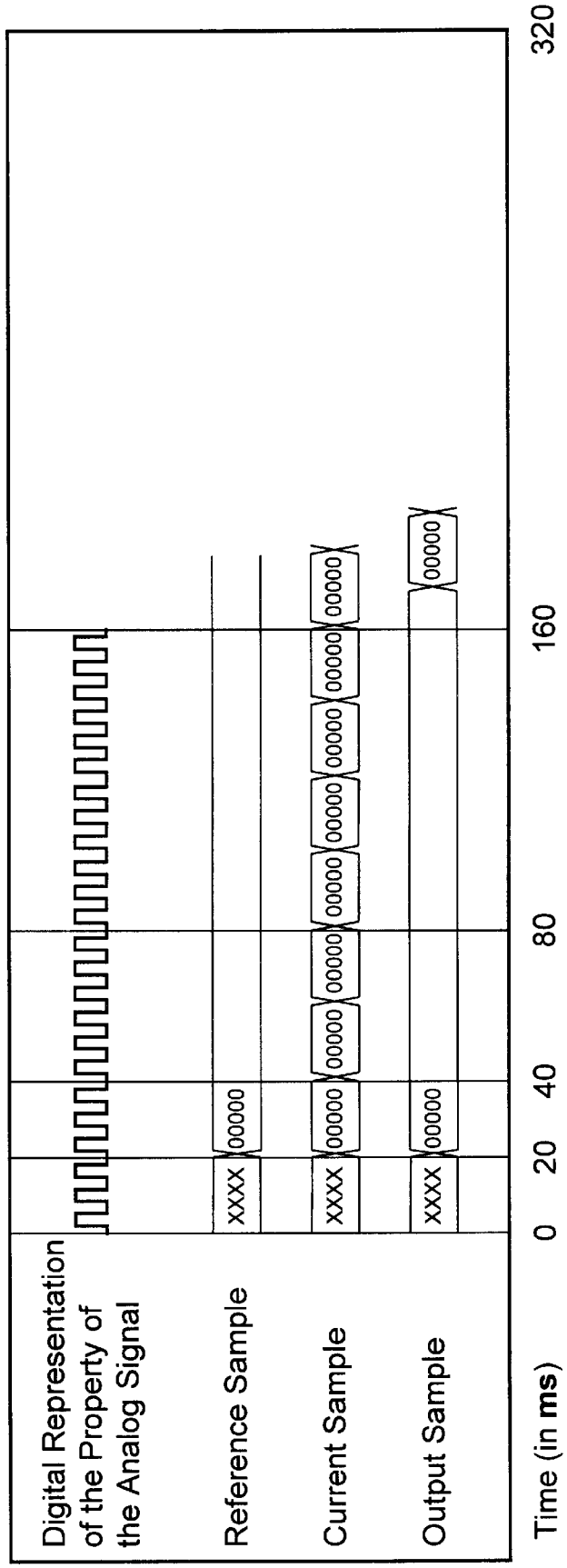
Figure 4H:
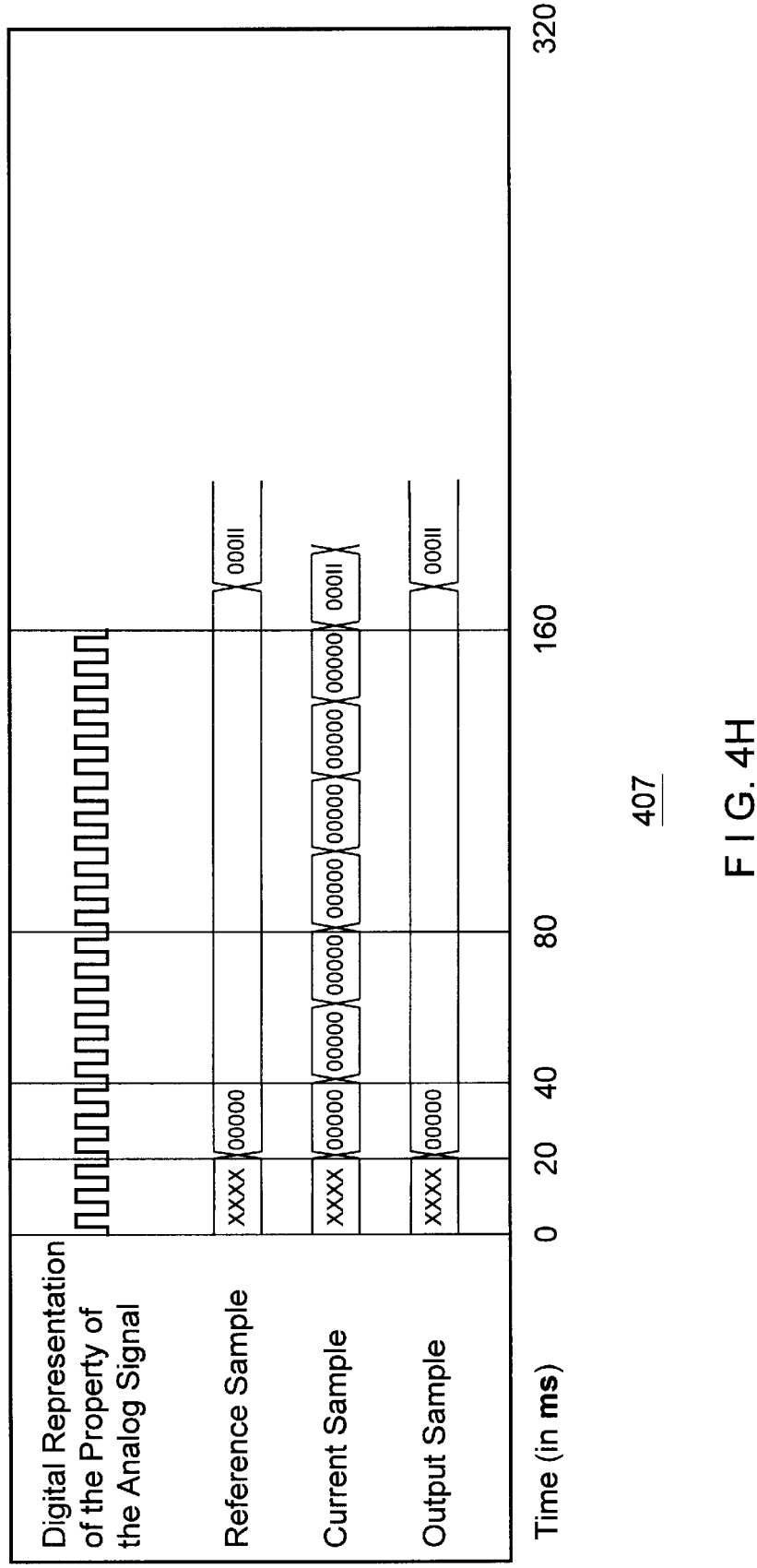

A timing diagram 404 of selected signals used in the process 300 illustrates this scenario is shown in FIG. 4E. Referring to FIG. 4E, the current sample has a value of '00000H after 80 ms has passed as does the reference sample, therefore a new fifteen-bit precision sample is provided as the output sample. If the difference between the long clock and the short clock is 160 ms, the processor 206 creates a sixteen-bit output sample by dividing the number of samples collected during the last 160 ms of the global clock by 160 ms and provides the sixteen-bit output sample to the current sample output. A timing diagram 406 of selected signals used in the process 300 illustrates this scenario is shown in FIG. 4G. Referring to FIG. 4G, the current sample has a value of '00000H after 160 ms has passed as does the reference sample, therefore a new sixteen-bit precision sample is provided as the output sample.

Figure 4I:
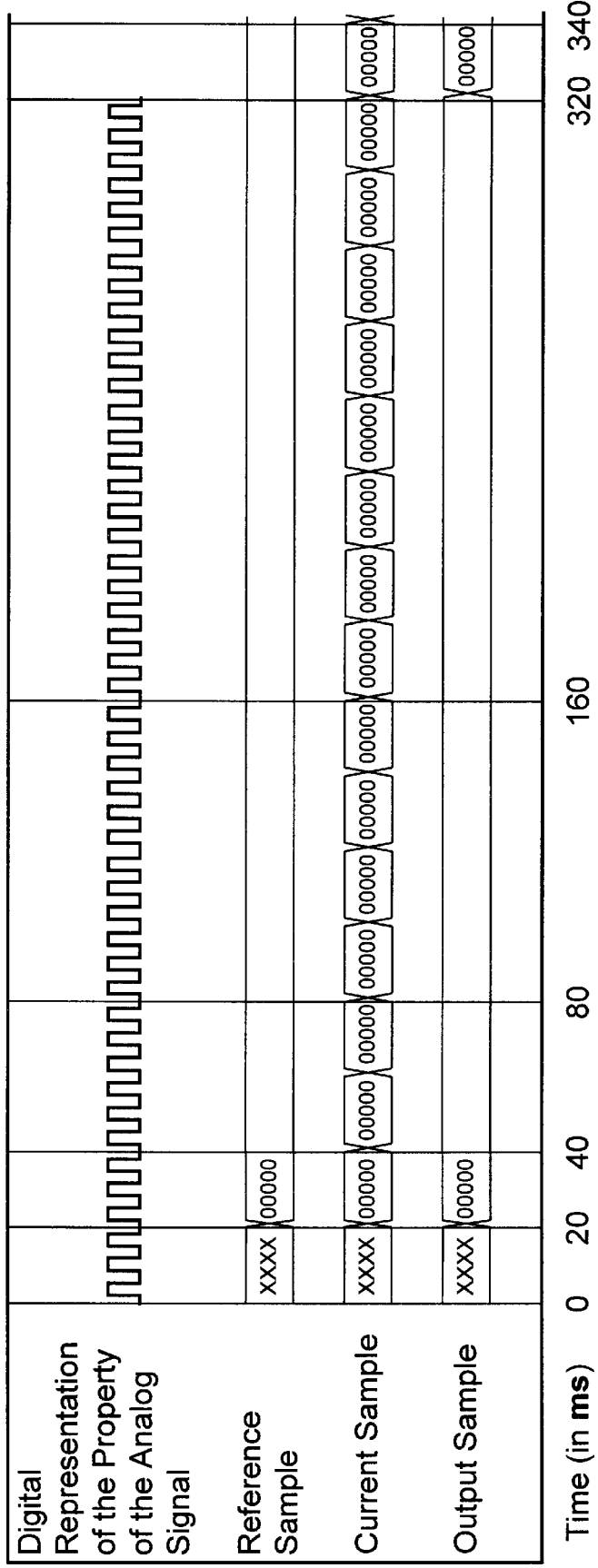
Figure 4J:
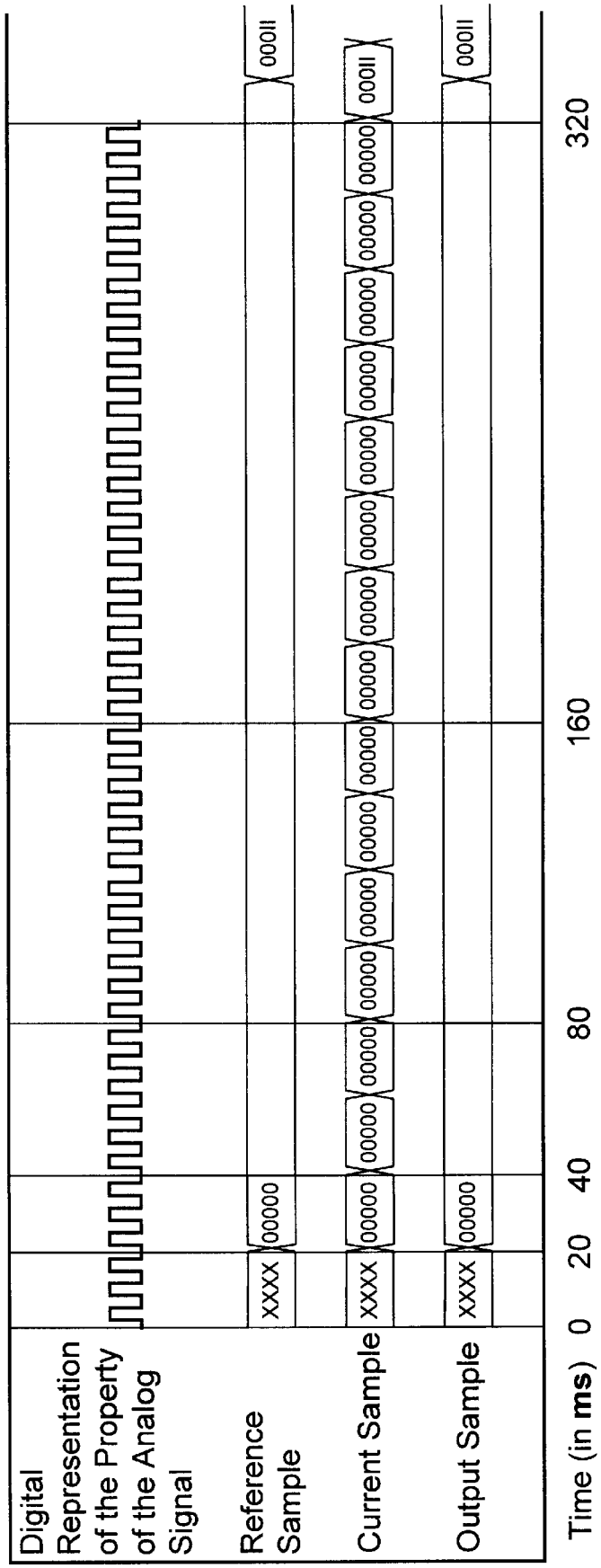

In step 320, a seventeen-bit output sample is created. The processor 206 provides the seventeen-bit output sample to the data output 212. Once the seventeen-bit output sample is provided to the data output 212, the long clock and the short clock are set to 0 ms. A timing diagram 408 of selected signals used in the process 300 illustrates this scenario is shown in FIG. 4I. Referring to FIG. 4I, the current sample has a value of '00000H after 320 ms has passed as does the reference sample, therefore a new seventeen-bit precision sample is provided as the output sample.

In a further exemplary embodiment, in step 320, a seventeen-bit output sample is created, and the processor 206 provides the seventeen-bit output sample to the data output 212. The processor 206 sets the long clock and the short clock to 0 ms, and generates a reference sample by dividing the number of samples collected during the last 20 ms of the global clock by 20 ms. Then, the processor 206 writes the current sample into the reference sample register 208 via the reference sample output of the processor 206. Once the thirteen-bit reference sample is provided to the reference sample register 208, the process 300 advances to the step 308 (as shown in dashed lines in FIG. 2).

What is claimed:

1. A method, comprising the steps of:
   obtaining a first digital sample related to an analog signal after a first time period;
   obtaining a second digital sample related to the analog signal after a second time period; and
   providing the second digital sample on at least one output if a magnitude of the first digital sample differs from a magnitude of the second digital sample by more than a predetermined threshold, wherein the difference between the magnitudes of the first and second digital samples exceeds the predetermined threshold if at least one bit of the first digital sample differs from a respective matching bit of the second digital sample.

2. The data acquisition method of claim 1, further comprising the steps of:
   obtaining a third digital sample related to the analog signal after a third time period; and
   providing the third digital sample on the at least one output if the magnitudes of the first digital sample, the second digital sample and the third digital sample differ from one another by less than the predetermined threshold.

3. The method of claim 1, wherein the second time period follows the first time period.

4. The method of claim 1, wherein the first digital sample and the second digital sample are provided at a particular precision.

5. The method of claim 1, wherein the first time period is equal to the second time period.

6. The method of claim 1, wherein the first digital sample is a thirteen-bit digital sample.

7. The method of claim 1, wherein the second digital sample is a thirteen-bit digital sample.

8. The method of claim 1, wherein the predetermined threshold is a percentage of the magnitude of the first digital sample.

9. The method of claim 2, wherein the third digital sample is a seventeen-bit digital sample.

10. The method of claim 2, wherein the difference between the magnitudes of the first and third digital samples exceeds the predetermined threshold if at least one bit of the first digital sample differs from a respective matching bit of the third digital sample.

11. The method of claim 2, wherein the third time period follows the second time period.

12. The method of claim 2, wherein the third digital sample is provided at a further precision.

13. The method of claim 2, wherein the first time period is shorter than the third time period.

14. The method of claim 2, wherein the third digital sample has a precision which is higher than the precision of the first digital sample.

15. The method of claim 2, wherein the third digital sample has a precision which is higher than a precision of the second digital sample.

16. A data acquisition system, comprising:
   a data processing unit including an at least one data input and at least one data output, wherein when executing a computer program, the data processing unit is adapted to:
   obtain a first digital sample related to an analog signal after a first time period;
   obtain a second digital sample related to the analog signal after a second time period;
   compare the second digital sample to the first digital sample; and
   provide the second digital sample on the at least one data output if a magnitude of the first digital sample differs from a magnitude of the second digital sample differ by more than a predetermined threshold, wherein the difference between the magnitudes of the first and second digital samples exceeds the predetermined threshold if at least one bit of the first digital sample differs from a respective matching bit of the second digital sample.

17. The data acquisition system of claim 16, wherein the predetermined threshold is a percentage of the magnitude of the first digital sample.

18. The data acquisition system of claim 16, wherein the data processing unit is further configured obtain a third digital sample related to the analog signal after a third time period, wherein the data processing unit compares the magnitude of the third digital sample to the magnitude of the first digital sample, wherein the data processing unit produces the third digital sample at the at least one data output if respective magnitudes of the first digital sample, the second digital sample and the third digital sample differ from one another by less than the predetermined threshold.

19. The data acquisition system of claim 16, further comprising:
   an analog to digital (A/D) converter including an A/D input and at least one A/D output, wherein the A/D input is configured to receive an analog signal, wherein the at least one A/D output is configured to provide a digital representation of the analog signal, and wherein the at least one A/D output is operatively connected to the at least one data input of the data processing unit.

20. The data acquisition system of claim 16, wherein the second time period follows the first time period.

21. The data acquisition system of claim 16, wherein the first digital sample and the second digital sample are provided at a particular precision.

22. The data acquisition system of claim 16, wherein the first time period is equal to the second time period.

23. The data acquisition system of claim 16, wherein the first digital sample is a thirteen-bit digital sample.

24. The data acquisition system of claim 16, wherein the second digital sample is a thirteen-bit digital sample.

25. The data acquisition system of claim 18, wherein the third digital sample has a precision which is higher than a precision of the second digital sample.

26. The data acquisition system of claim 18, wherein the third digital sample is a seventeen-bit digital sample.

27. The data acquisition system of claim 18, wherein the difference between the magnitudes of the first and third digital samples exceeds the predetermined threshold if at least one bit of the first digital sample differs from a respective matching bit of the third digital sample.

28. The data acquisition system of claim 18, wherein the third time period follows the second time period.

29. The data acquisition system of claim 18, wherein the third digital sample is provided at a further precision.

30. The data acquisition system of claim 18, wherein the first time period is shorter than the third time period.

31. The data acquisition system of claim 18, wherein the third digital sample has a precision which is higher than a precision of the first digital sample.

32. A data acquisition system, comprising:
 a data processing unit including an at least one data input and at least one data output, wherein when executing a computer program, the data processing unit is adapted to:
 obtain a first digital sample related to an analog signal after a first time period;
 obtain a second digital sample related to the analog signal after a second time period;
 provide the second digital sample on the at least one data output if a magnitude of the first digital sample differs from a magnitude of the second digital sample differ by more than a predetermined threshold;
 obtain a third digital sample related to the analog signal after a third time period; and
 provide the third digital sample at the at least one data output if respective magnitudes of the first digital sample, the second digital sample and the third digital sample differ from one another by less than the predetermined threshold.

33. The data acquisition system of claim 32, wherein the third digital sample has a precision which is higher than a precision of the first digital sample.

34. The data acquisition system of claim 32, wherein the first time period is shorter than the third time period.

35. The data acquisition system of claim 32, wherein the first digital sample and the second digital sample are provided at a particular precision.

36. The data acquisition system of claim 32, wherein the predetermined threshold is a percentage of the magnitude of the first digital sample.

37. The data acquisition system of claim 32, wherein the difference between the magnitudes of the first and third digital samples exceeds the predetermined threshold if at least one bit of the first digital sample differs from a respective matching bit of the third digital sample.

38. The data acquisition system of claim 32, wherein the third digital sample is provided at a further precision.

39. A method, comprising the steps of:
 obtaining a first digital sample related to an analog signal after a first time period;
 obtaining a second digital sample related to the analog signal after a second time period;
 providing the second digital sample on at least one output if a magnitude of the first digital sample differs from a magnitude of the second digital sample by more than a predetermined threshold;
 obtaining a third digital sample related to the analog signal after a third time period; and
 providing the third digital sample on the at least one output if the magnitudes of the first digital sample, the second digital sample and the third digital sample differ from one another by less than the predetermined threshold.

40. The method of claim 39, wherein the third digital sample has a precision which is higher than a precision of the first digital sample.

41. The method of claim 39, wherein the third digital sample is provided at a further precision.

42. The method of claim 39, wherein the first digital sample and the second digital sample are provided at a particular precision.

43. The method of claim 39, wherein the predetermined threshold is a percentage of the magnitude of the first digital sample.

44. The method of claim 39, wherein the difference between the magnitudes of the first and third digital samples exceeds the predetermined threshold if at least one bit of the first digital sample differs from a respective matching bit of the third digital sample.

45. A storage medium storing a software program, wherein the software program, when executed by a processing arrangement, is configured to cause the processing arrangement to execute the steps comprising of:
 obtaining a first digital sample related to an analog signal after a first time period;
 obtaining a second digital sample related to the analog signal after a second time period;
 providing the second digital sample on at least one output if a magnitude of the first digital sample differs from a magnitude of the second digital sample by more than a predetermined threshold;
 obtaining a third digital sample related to the analog signal after a third time period; and
 providing the third digital sample on the at least one output if the magnitudes of the first digital sample, the second digital sample and the third digital sample differ from one another by less than the predetermined threshold.

46. The storage medium of claim 45, wherein the first digital sample and the second digital sample are provided at a particular precision.

47. The storage medium of claim 45, wherein the predetermined threshold is a percentage of the magnitude of the first digital sample.

48. The storage medium of claim 45, wherein the difference between the magnitudes of the first and third digital samples exceeds the predetermined threshold if at least one bit of the first digital sample differs from a respective matching bit of the third digital sample.

49. The storage medium of claim 45, wherein the third digital sample is provided at a further precision.

50. A logic arrangement adapted for execution by a processing arrangement to perform the steps comprising of:
   obtaining a first digital sample related to an analog signal after a first time period;
   obtaining a second digital sample related to the analog signal after a second time period;
   providing the second digital sample on at least one output if a magnitude of the first digital sample differs from a magnitude of the second digital sample by more than a predetermined threshold;
   obtaining a third digital sample related to the analog signal after a third time period; and
   providing the third digital sample on the at least one output if the magnitudes of the first digital sample, the second digital sample and the third digital sample differ from one another by less than the predetermined threshold.

51. The logic arrangement of claim 50, wherein the first digital sample and the second digital sample are provided at a particular precision.

52. The logic arrangement of claim 50, wherein the predetermined threshold is a percentage of the magnitude of the first digital sample.

53. The logic arrangement of claim 50, wherein the difference between the magnitudes of the first and third digital samples exceeds the predetermined threshold if at least one bit of the first digital sample differs from a respective matching bit of the third digital sample.

54. The logic arrangement of claim 50, wherein the third digital sample is provided at a further precision.

55. A storage medium storing a software program, wherein the software program, when executed by a processing arrangement, is configured to cause the processing arrangement to execute the steps comprising of:
   obtaining a first digital sample related to an analog signal after a first time period;
   obtaining a second digital sample related to the analog signal after a second time period; and
   providing the second digital sample on at least one output if a magnitude of the first digital sample differs from a magnitude of the second digital sample by more than a predetermined threshold, wherein the difference between the magnitudes of the first and second digital samples exceeds the predetermined threshold if at least one bit of the first digital sample differs from a respective matching bit of the second digital sample.

56. The storage medium of claim 55, wherein the first digital sample and the second digital sample are provided at a particular precision.

57. The storage medium of claim 55, wherein the first time period is equal to the second time period.

58. The storage medium of claim 55, wherein the predetermined threshold is a percentage of the magnitude of the first digital sample.

59. A logic arrangement adapted for execution by a processing arrangement to perform the steps comprising of:
   obtaining a first digital sample related to an analog signal after a first time period;
   obtaining a second digital sample related to the analog signal after a second time period; and
   providing the second digital sample on at least one output if a magnitude of the first digital sample differs from a magnitude of the second digital sample by more than a predetermined threshold, wherein the difference between the magnitudes of the first and second digital samples exceeds the predetermined threshold if at least one bit of the first digital sample differs from a respective matching bit of the second digital sample.

60. The logic arrangement of claim 59, wherein the first digital sample and the second digital sample are provided at a particular precision.

61. The logic arrangement of claim 59, wherein the first time period is equal to the second time period.

62. The logic arrangement of claim 59, wherein the predetermined threshold is a percentage of the magnitude of the first digital sample.

* * * * *

UNITED STATES PATENT AND TRADEMARK OFFICE
CERTIFICATE OF CORRECTION

PATENT NO. : 6,621,443 B1
DATED : September 16, 2003
INVENTOR(S) : Selli et al.

It is certified that error appears in the above-identified patent and that said Letters Patent is hereby corrected as shown below:

Title page,
Item [73], Assignee, insert -- Smar Research Corporation, 4250 Veterans Memorial Highway, Holbrook, New York 11741 --

Signed and Sealed this

Twenty-eighth Day of September, 2004

JON W. DUDAS
*Director of the United States Patent and Trademark Office*